United States Patent
Fujiwara et al.

[11] 4,005,396
[45] Jan. 25, 1977

[54] DIGITAL DISPLACEMENT SENSOR WITH ZIGZAG COILS

[75] Inventors: Hideo Fujiwara, Tachikawa; Yukio Ichinose, Kokubunji; Kazuo Ichino, Hamura; Isamu Orita, Kokubunji; Yasutaro Uesaka, Hachioji; Michiyasu Itoh, Kodaira; Hisashi Thuruoka, Oume, all of Japan

[73] Assignee: Hitachi, Ltd., Japan

[22] Filed: Nov. 18, 1974

[21] Appl. No.: 524,867

[30] Foreign Application Priority Data

Nov. 16, 1973 Japan .......................... 48-128903
Dec. 24, 1973 Japan .......................... 48-143479
Dec. 24, 1973 Japan .......................... 48-143480

[52] U.S. Cl. .............................. 340/196; 323/53;
324/34 PS; 336/119; 336/120; 336/129;
340/204; 360/123

[51] Int. Cl.² ................ G08C 9/04; G08C 19/28

[58] Field of Search ............ 340/196, 204, 347 AD,
340/195; 323/51, 52, 53; 178/19; 336/119,
129, 120, 132; 324/34 D, 34 PS, 173;
360/123, 25, 124; 325/378

[56] References Cited
UNITED STATES PATENTS

| 1,743,124 | 1/1930 | Esau et al. ........................ 325/378 |
| 1,798,592 | 3/1931 | Davis ............................... 340/196 |
| 3,281,825 | 10/1966 | Corl et al. ....................... 324/173 |
| 3,293,636 | 12/1966 | Dunne .............................. 324/173 |
| 3,382,472 | 5/1968 | Maass .............................. 336/119 |
| 3,399,401 | 8/1968 | Ellis et al. ....................... 323/93 |
| 3,437,956 | 4/1969 | Davis ............................... 324/173 |
| 3,504,359 | 3/1970 | Hawksworth ..................... 324/173 |
| 3,758,845 | 9/1973 | MacKelvie et al. ................ 323/51 |

Primary Examiner—John W. Caldwell
Assistant Examiner—James J. Groody
Attorney, Agent, or Firm—Craig & Antonelli

[57] ABSTRACT

A digital displacement sensor includes a plurality of zigzag coils provided with projecting or convex portions having different pitches and arranged on the surface of a flat plate. A magnetic head consisting of a magnetic body and a coil is wound around part of the magnetic body, the magnetic head being supported so as to be moved, while maintaining a given gap from the surface of the flat plate, whereby a digital signal corresponding to the displacement of the magnetic head is sensed by means of a plurality of zigzag coils.

12 Claims, 16 Drawing Figures

DIGITAL DISPLACEMENT SENSOR WITH ZIGZAG COILS

BACKGROUND OF THE INVENTION

1. Field of the Invention

This invention relates to a digital displacement sensor for converting the displacement of a moving member into a digital signal commensurate with the displacement of the moving member and, more particularly, to a device for converting the opening angle of a throttle valve of a motor vehicle or other transporting vehicle into a digital signal.

2. Description of the Prior Art

A typical digital displacement sensor which has been employed widely hitherto is a displacement detector having digital electrical contacts and consisting of a plurality of stationary electrodes electrically insulated from each other, and a moving element having a brush and adapted to slide on the electrodes. However, such a displacement detector suffers from disadvantages such as excessive wear of the contacts and noise developed upon the opening and closing of the contacts. On the other hand, for avoiding the aforesaid disadvantages, there have been proposed various types of non-contact type displacement sensors. Inductosyn (Trade Mark) is one of the examples, in which a stationary element having a zigzag coil formed in a plane and a moving element are arranged in opposing but spaced relation to the coil surface, so that the displacement of the moving element is detected by utilizing the variation in mutual inductance depending on the relative positions of the zigzag coil.

However, such a sensor provides only an output signal having the alternatives of a 0 or a 1 depending on the displacement of the moving element, so that it is imperative to provide a sensor for sensing the moving direction of the moving element and a device for calculating and storing an output signal, for the purpose of detecting the direction and extent of displacement of the moving element, resulting in a complicated construction.

In addition, there has been proposed an encoder type sensor utilizing light beams. This, however, poses other disadvantages such as premature deterioration of a light source, and the need to use extremely high precision for relative alignment of the position of a light source with that of an encoding plate. This poses still another problem in materializing a photo-detector which has a rapid response and withstands a high ambient temperature. Accordingly, those attempts are not suitable for detecting the opening angle of a throttle valve rapidly.

SUMMARY OF THE INVENTION

It is an object of the present invention to provide a digital displacement sensor having a simple arrangement and avoiding the aforesaid shortcomings experienced with the prior art.

More specifically, it is a principal object of the present invention to provide a digital displacement sensor which can sense the displacement of a stationary element relative to that of a moving element at a high accuracy and is durable for a long period of time under severe service conditions.

It is another object of the present invention to provide a digital displacement sensor which is scarcely affected by an electromagnetic wave such as from a distributor on a motor vehicle and has a high signal-to-noise ratio.

It is a further object of the present invention to provide a digital displacement sensor which is provided with a zigzag coil for which the temperature characteristic of which in a displacement-sensing portion is compensated.

According to one aspect of the present invention which attains the aforesaid objects, there is provided a digital displacement sensor consisting of a stationary element having zigzag coils on the surface of a flat plate and a moving element having a magnetic body wound with a coil therearound, the moving element being adapted to move, while maintaining a given gap from the surface of the flat plate.

According to another aspect of the present invention, there is provided a digital displacement sensor, in which there are provided, on the surface of a flat plate zigzag coils for use in picking up noise, in addition to the aforesaid zigzag coils, so that an output of one coil is subtracted from an output from another coil.

According to a further aspect of the present invention, there is provided a digital displacement sensor, in which there is provided another flat coil having substantially the same temperature characteristic as that of the aforesaid zigzag coil, so that an output from one coil is subtracted from output from another coil.

These and other objects, features and advantages of the present invention will become apparent from the following detailed description when read in conjunction with the accompanying drawings.

DETAILED DESCRIPTION

Figure 1:
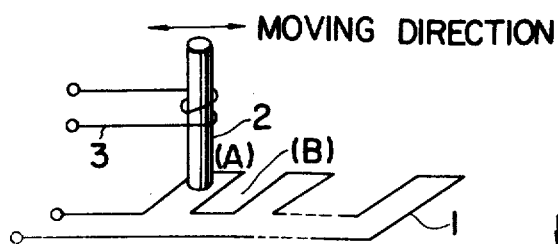
FIG. 1 is a view illustrating the principle incorporated in the present invention.
Figure 3:
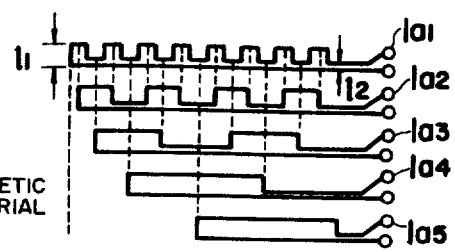
FIG. 3 is a view showing a group of sensing coils for use in the sensor according to the present invention.

The principle of the present invention will be explained with reference to FIG. 1. Shown in FIG. 1 is a sensing coil 1 of a flat plate form which has a saw-tooth pattern (This sensing coil will be referred to as a zigzag sensing coil, hereinafter), and a magnetic head 2 consisting of a soft magnetic body and a coil 3 wound therearound. When the magnetic head 2 is moved relative to the coil 1 in the direction shown by the arrow in the drawing, with an exciting current flowing through the coil 3, a voltage having a frequency equal to that of the aforesaid exciting current will be induced to the opposite ends of the coil 1, because, when the magnetic head 2 is in the position (A) in the drawing, a majority of alternate magnetic fluxes produced from the edge of the magnetic head 2 interlinks the coil 1, and on the other hand, when the magnetic head 2 is in the position (B) in the drawing, then the alternate magnetic fluxes will not interlink the coil 1, so that the level of voltage induced will be decreased. Accordingly, by monitoring the voltages induced in the opposite ends of the coil 1, the relative positional relationship between the magnetic head 2 and the coil 1 may be determined.

Figure 2:
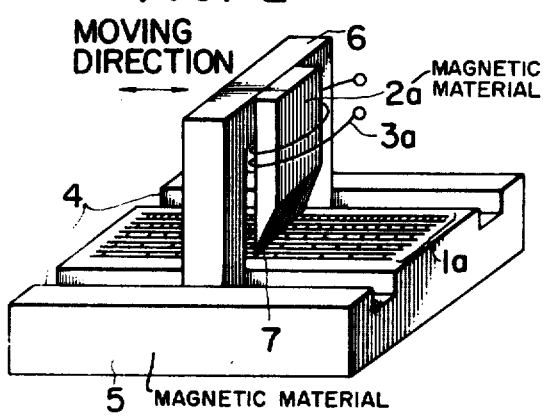
FIG. 2 is a view showing one embodiment of the displacement sensor according to the present invention.

FIG. 2 shows the arrangement of one embodiment of the present invention. A stationary element 5 consisting of an Ni—Zn ferrite substrate has grooves 4 therein. Formed on the surface of the element 5 are a group of sensing coils 1a. The sensing coils 1a consist of five sensing coils 1a1 to 1a5 formed in a zigzag pattern with projecting or convex portions having different pitches.

On the other hand, a moving element consists of a magnetic head 2a, around which an exciting magnetic coil 3a is wound and a gate shaped support 6 of an Ni—Zn ferrite, which supports the magnetic head 2a thereon. The moving element slides along the grooves 4 in the stationary element 5, while the surface of the stationary element, on which are formed a group of sensing coils 1a, is maintained in parallel with the sharp edge 7 of magnetic head 2a. The substrate of the stationary element 5 as well as the gate shaped support 6 for the magnetic head 2a are formed of an Ni—Zn ferrite so that the sensitivity may be maintained constant despite the varying pitches of the respective coils, by preventing magnetic fluxes produced from the edge 7 of magnetic head 2a from returning to their original position through sensing coils, after the aforesaid magnetic fluxes have passed through the same sensing coils.

Figure 4:
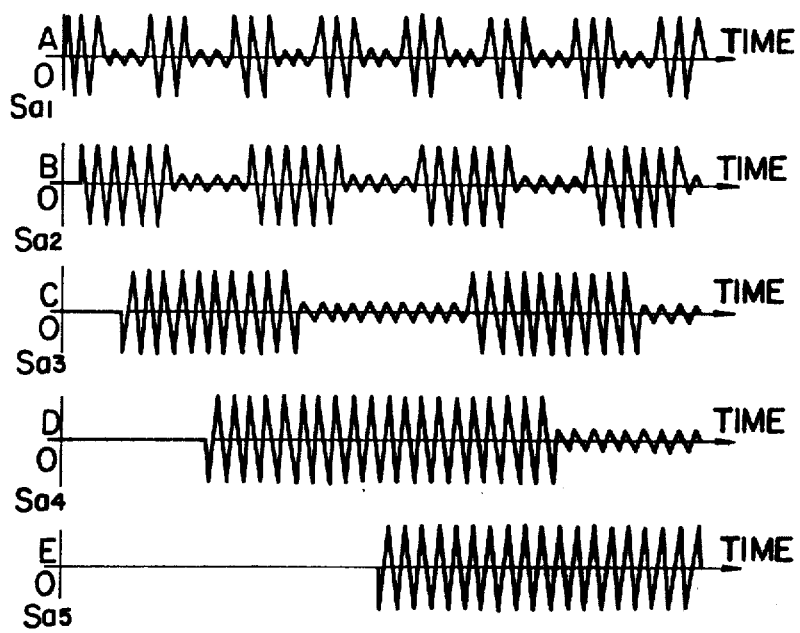
FIG. 4 is a group of time charts showing waveforms of sensing signals obtained from the sensing coil group shown in FIG. 3.

FIG. 4 shows outputs $Sa1$, $Sa2$, $Sa3$, $Sa4$ and $Sa5$ from coil groups $1a1$, $1a2$, $1a3$, $1a4$, $1a5$, when the magnetic head 2a is moved in one direction at a constant speed, with a high frequency current being caused to flow through the coil 3a in such a sensor. The aforesaid outputs $Sa1$ to $Sa5$ are rectified and detected for detecting the amplitudes of respective outputs and then converted into digital signals at a suitable threshold value. As is apparent from the drawing, digital signals of 5 bits obtained from coils $1a1$ to $1a5$ vary depending on the positions of magnetic head 2a, so that the position of magnetic head 2a may be determined by sensing such digital signals.

While, in the aforesaid embodiment, stationary element 5 and support 6 are made of an Ni—Zn ferrite, other soft magnetic materials may be used in its place. Particularly in case a high speed reading-out function is not required, soft magnetic metals such as iron, permalloy, and the like, may be used.

In addition, the spacings $l_1$ between the adjoining lines of the convex portion of the respective coils are rendered equal to each other to thereby obtain substantially equal sensing outputs from the respective coils. Also, a larger ratio may be obtained for the output resulting where the edge portion of the magnetic head 2a is positioned in the convex portion of the sensing coil to the output resulting in the case where the edge portion of the magnetic head 2a is positioned in the concave portion, by making the ratio of the distance $l_1$ to the distance $l_2$ between the opposing lines of the concave portion of the respective coils larger. In principle, a plurality of rows of coils and magnetic heads as shown in FIG. 1 may be arranged so as to sense displacements. In the embodiment, however, a single magnetic head is used for simplifying the arrangement, with the edge portion being sharpened.

Figure 5:
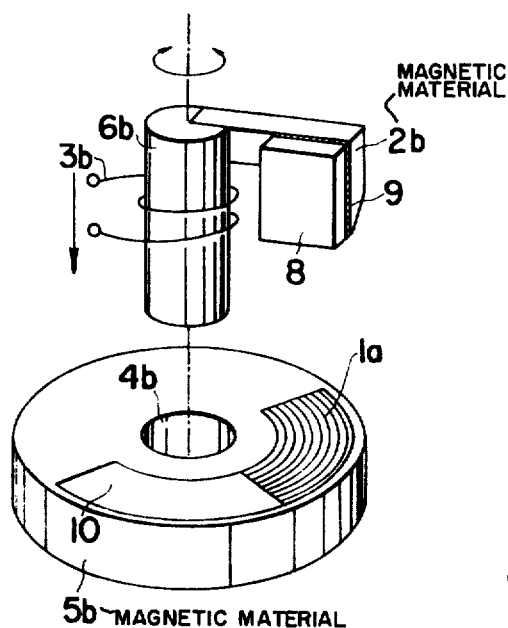
FIG. 5 is a view showing another embodiment of the sensor according to the present invention.

FIG. 5 shows the arrangement of another embodiment for sensing a rotational angle. With this embodiment, the stationary element consists of a ferrite disc 5b having a center hole 4b and a group of zigzag coils 1a extending along the circumference of the disc 5b. On the other hand, a moving element consists of a ferrite column 6b having a notch in part thereof and having windings 3b wound therearound, and a head portion composed of a ferrite member 2b fitted in the aforesaid notch, vitreous non-magnetic body 8 and a thin metal piece 9 of a high permeability, such as a permalloy. Part of the aforesaid ferrite column 6b is inserted into a hole 4b in the ferrite disc 5b, with the aforesaid head portion opposing to the surface, on which are formed coils 1a. In addition, it is recommendable to use photo etching or a print substrate for preparing wirings of the sensing coil group 1a. Furthermore, it may be desirable to coat the surfaces with Teflon and the like.

Figure 6:
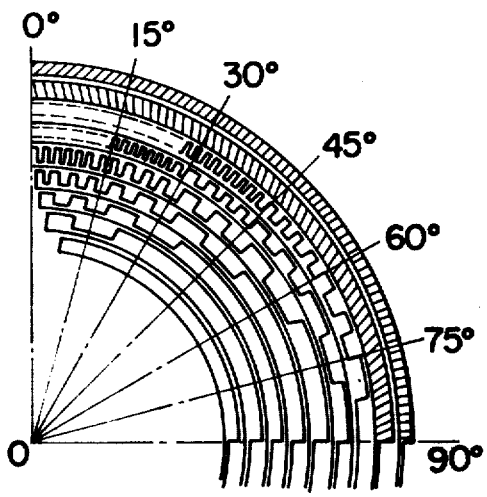
FIG. 6 is a view showing the arrangement of the sensing coils used in the sensor of FIG. 5.

Shown at 10 are an output terminal portion of sensing coil group 1a. In this embodiment, the coil group 1a is arranged as shown in FIG. 6, and the angle ranging from 0° to 90° is divided into six ranges of angles, 0° to 15°, 15° to 30°, 30° to 45°, 45° to 60°, 60° to 75°, 75° to 90°, so that accuracy is doubled for each decrease in angle range. One of the features of the present invention is that the level of accuracy may be adjusted depending on sensing positions. In addition, two coils on the outermost circumference are zigzag coils of the shortest equi-frequency, the relative angular positions of coils being out of phase by one quarter wavelength, to thereby detect the rotating direction of a rotor. The extremely detailed patterns are omitted in FIG. 6.

Meanwhile, when the aforesaid sensor is used for sensing the opening angle of a throttle valve of a motor vehicle, the sensor should be so designed as to be positioned in the engine compartment of the vehicle. As is well known, the engine compartment of a motor vehicle produces very intense electromagnetic waves from the distributor and the like, and thus such electromagnetic waves are sensed as noise by means of the aforesaid angular sensing means (or zigzag flat coils), thus presenting causes for lowering the signal noise ratio. For lowering the noise level due to induction noise, it has been general practice to shield the electromagnetic waves. However, the shielding of the electromagnetic waves is not always easy in practice. With the angle sensing means designed so as to be provided within the engine compartment of a motor vehicle, it is desirable to make the size of the sensor as compact as possible. Accordingly, a decrease in the space for shielding the induction noise is not the proper solution. Since the sensing coil (zigzag coils) of the present invention are placed in close contact with the surface of a soft magnetic material of a high permeability, such as ferrite, it is impossible to prevent the zigzag coils from picking-up induction noise.

According to the present invention, there is provided, on a substrate of a high magnetic permeability, noise pick-up flat coils encompassing an area equal to the effective areas encompassed with the respective zigzag coils arranged on the aforesaid substrate, with the aforesaid respective zigzag coils being connected to the aforesaid noise pick-up coils in opposing directions, for the purpose of erasing noise.

Figure 7:
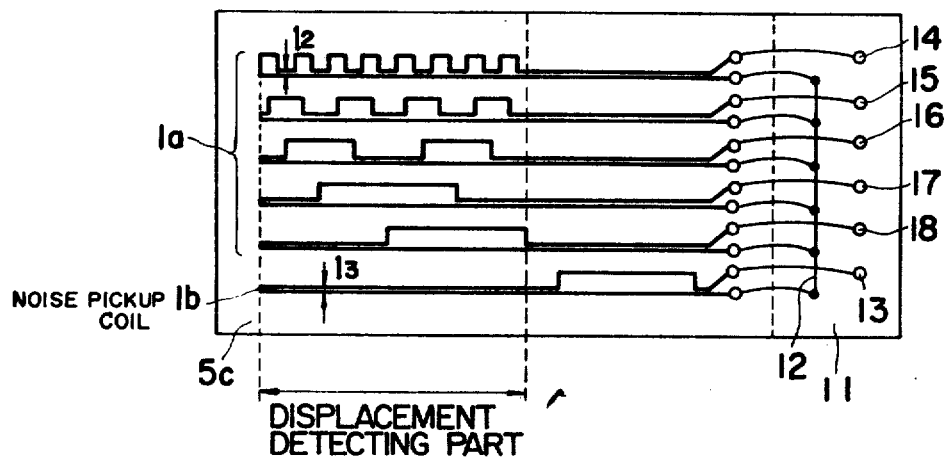
FIG. 7 is a view showing another arrangement of the sensing coils.

FIG. 7 shows an embodiment of coil groups provided on a stationary element. Provided on the surface of a ferrite substrate $5c$ having insulating films thereon are a zigzag coil group $1a$ and a noise pick-up coil $1b$. In this respect, the convex portion of noise pick-up coil $1b$ is positioned out of the displacement sensing range, while the output of the noise pick-up coil within the range of the displacement sensing range is maintained so as to correspond to 0. In addition, the effective areas encompassed on the surface of the plate by the respective coils $1a$ and $1b$ are equal, so that the levels of noises to be picked up by the respective coils $1a$ and $1b$ are substantially equal. The ferrite substrate $5c$ is coupled to a ceramic terminal plate 11 provided with terminals 13 to 18 thereon. One of the terminals of noise pick-up coil $1b$ is connected to terminal 13 of a terminal plate 11, while one terminal of each coil of the sensing coil group $1a$ is connected to terminals 14, 15, 16, 17, 18, respectively. Furthermore, the other terminals of the respective coils $1a$ and $1b$ are connected in common, so that a voltage induced by the zigzag coil group $1a$ is of an opposite phase to that induced by the noise pick-up coil $1b$. Accordingly, if voltages between the terminal 13 of the noise pick-up coil and the respective terminals 14, 15, 16, 17, 18 of the other coil group are measured, then noise due to external induction noise may be almost erased. In this respect, if the distance $l_2$ between the opposing lines in the concave portion of the sensing coil group $1a$ is equal to the distance $l_3$ between the lines in the noise pick-up coil $1b$, then a sensing output when the magnetic head is positioned in the concave portion of the sensing coil may be substantially "zero", so that a sensing output may be readily distinguished between 1 and 0, thereby preventing erroneous operations. Furthermore, an output voltage devoid of a noise voltage may be obtained by coupling the output voltages of the respective coils of the coil group $1a$ and an output voltage of the noise pick-up coil $1b$ to a differential amplifier.

Figure 8:
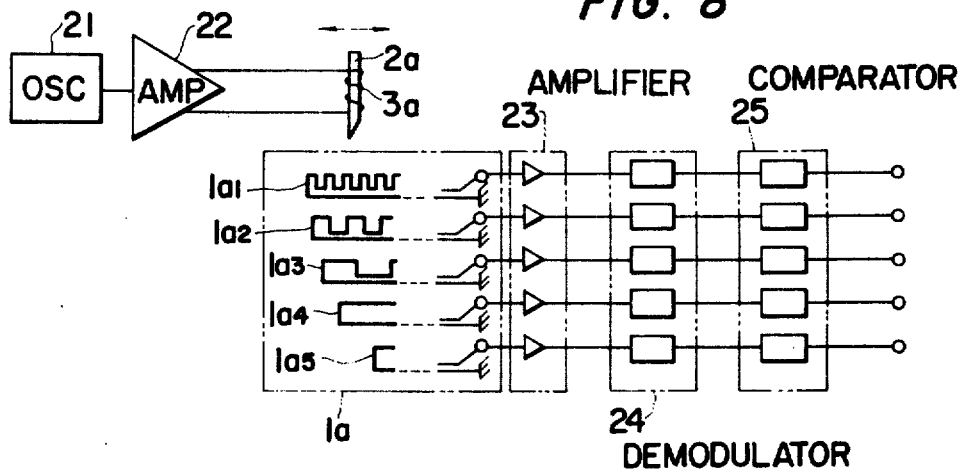
FIGS. 8 and 9 are block diagrams showing the arrangements of an output circuit portion of a sensor according to the present invention.
Figure 9:
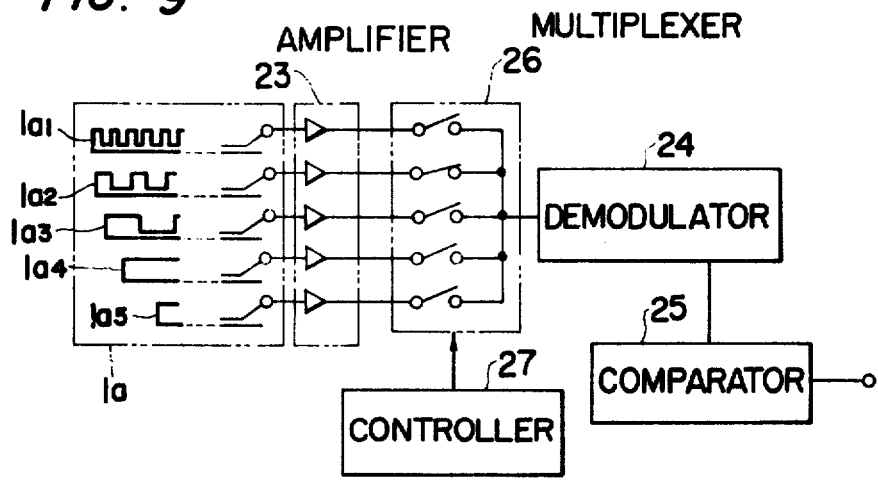

FIG. 8 shows a block diagram showing the entire arrangement of the aforesaid sensor including an electric circuit portion. The magnetic head $2a$ may be excited by amplifying an output from an oscillator (frequency = 1 MHz) by means of amplifier 22 and then impressing the output from the amplifier 22 on a coil $3a$. The magnetic fluxes produced from the aforesaid head $2a$ are picked up by means of zigzag coil group $1a$. The magnetic fluxes picked up by means of the respective zigzag coils $1a1$, $1a2$, $1a3$, $1a4$, $1a5$ vary depending on the positions of the aforesaid head $2a$, while the outputs from the respective zigzag coils are amplified by a preamplifier 23 and via a demodulating circuit 24, comparator 25, provide outputs 1 and 0.

With the aforesaid arrangement, the outputs from the respective zigzag sensing coils $1a$ are amplified, demodulated and compared in parallel relationship, so that there are the required demodulating circuits and comparator circuits of a number equal to that of zigzag coils. In contrast thereto, insertion of a multiplexer 26 controlled by means of a controller 27 in the downstream of a preamplifier 23 may reduce the numbers of the demodulators and comparators to 1, respectively.

Meanwhile, since the output from the aforesaid sensor varies with variation in temperature, there is the possibility of an erroneous output being produced, if a sensing output, which is obtained by the reference voltage determined independently of the temperature — dependent characteristics of the aforesaid output, is given as a two digit value.

Figure 10:
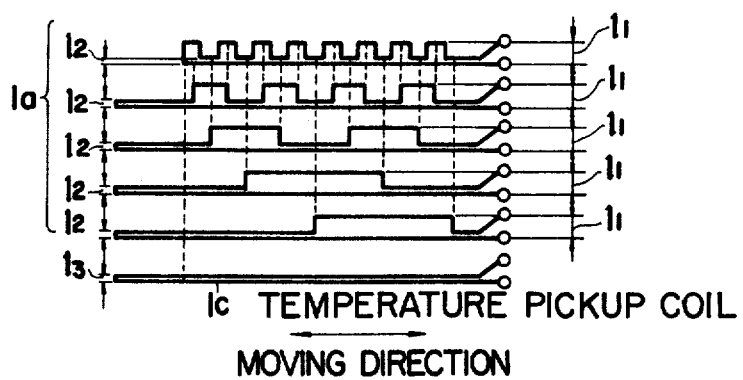
FIG. 10 is a view showing a still another arrangement of a sensing coil group.

For avoiding this shortcoming, there is provided on the same substrate, as shown in FIG. 10, a zigzag coil $1c$ having a distance equal to the distance $l_2$ between coils in the concave portion of the sensing coil group $1a$, so the output from coil $1c$ is deducted from the respective outputs from the sensing coil group $1a$.

Figure 11:
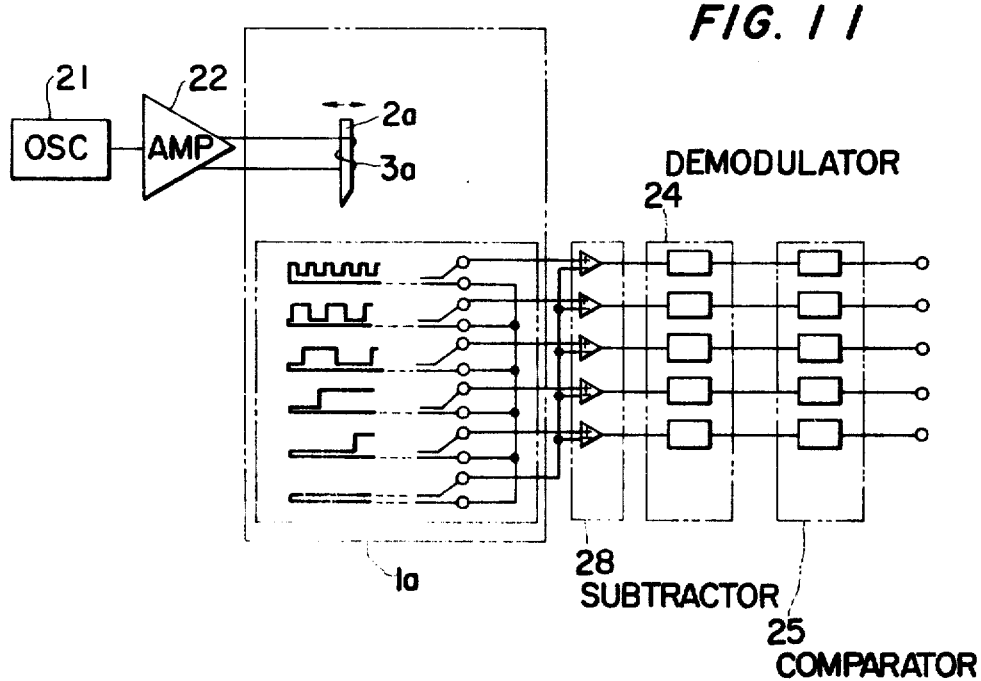
FIG. 11 is a block diagram showing another arrangement of an output circuit portion of the sensor according to the present invention.

In other words, as shown in FIG. 11, the output of the sensing coil group $1a$ and that of the coil $1c$ are added to a deductor 28, respectively, to thereby produce a difference therebetween, and then the difference is demodulated and compared with the reference voltage at the comparator 25 for providing a digital output.

Figure 12:
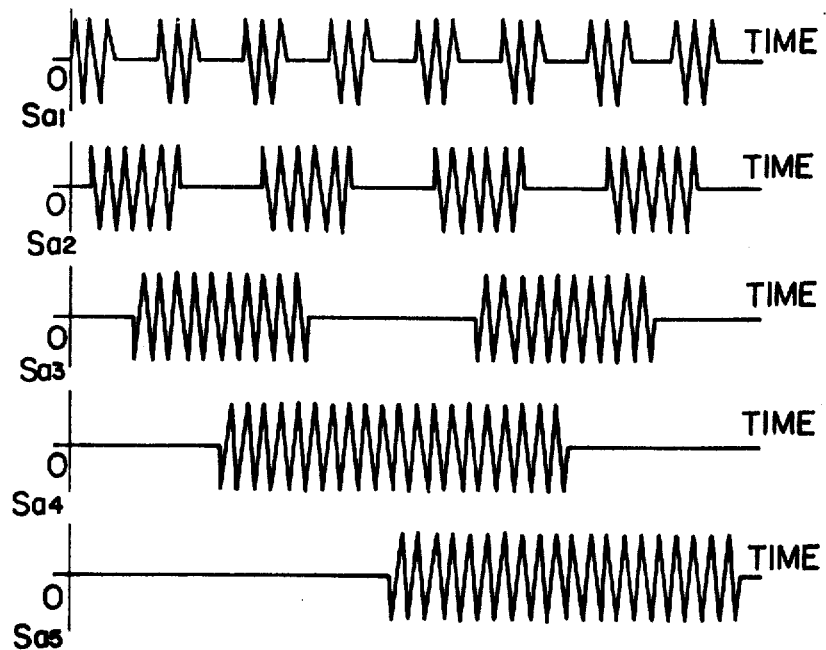
FIG. 12 is a group of time charts showing waveforms of sensing signals obtained from a sensing coil group shown in FIG. 10.

With this arrangement, the outputs from a subtractor group 28 will be as shown in FIG. 12 and present an advantage in preventing erroneous outputs at the time of the digitizing, as compared with the wave forms shown in FIG. 4.

On the other hand, by setting the width $l_3$ of coil $1c$ equal to ½ $(l_1 + l_2)$, the output obtained from the coil $1c$ may be used as a reference input for the comparator 25, after being rectified. In this case, as well, it is apparent that the temperature-dependent characteristics of the output of the sensing coil $1a$ may be compensated.

Figure 13:
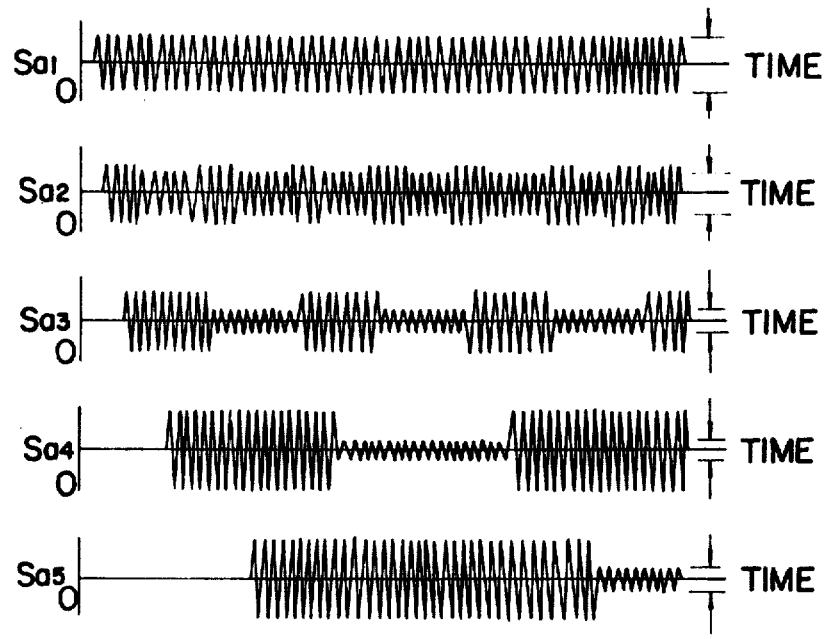
FIG. 13 is groups of time charts showing waveforms of sensing signals obtained in an experiment carried out using the present invention.
Figure 14:
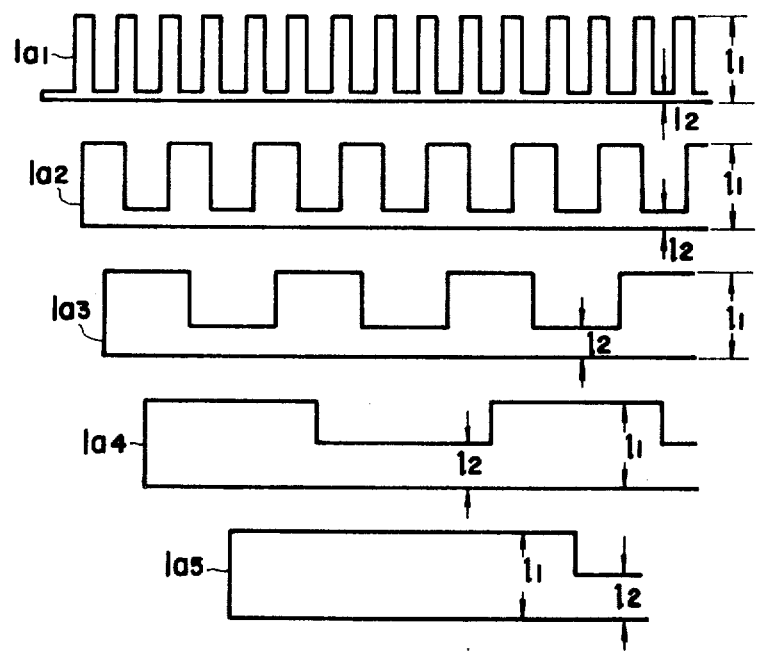
FIGS. 14–16 are views of various arrangements of the coils used in accordance with the present invention.
Figure 15:
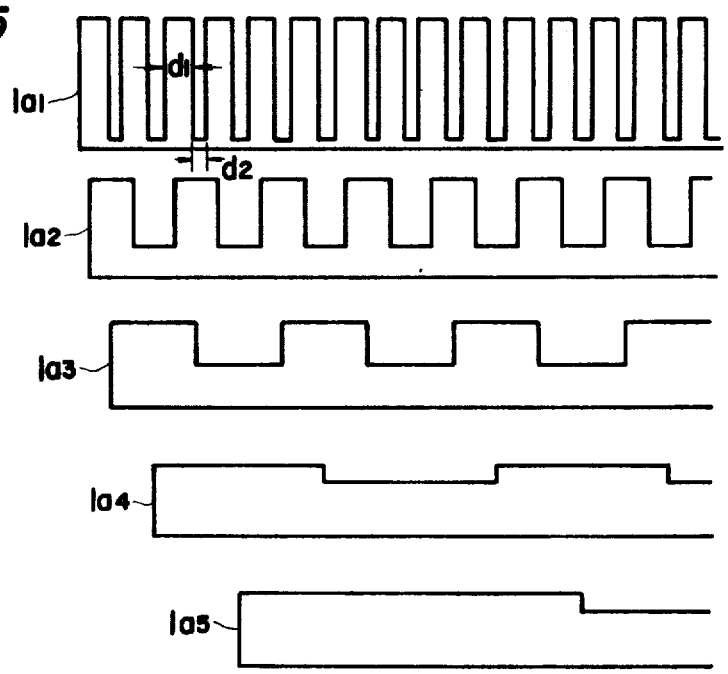
Figure 16:
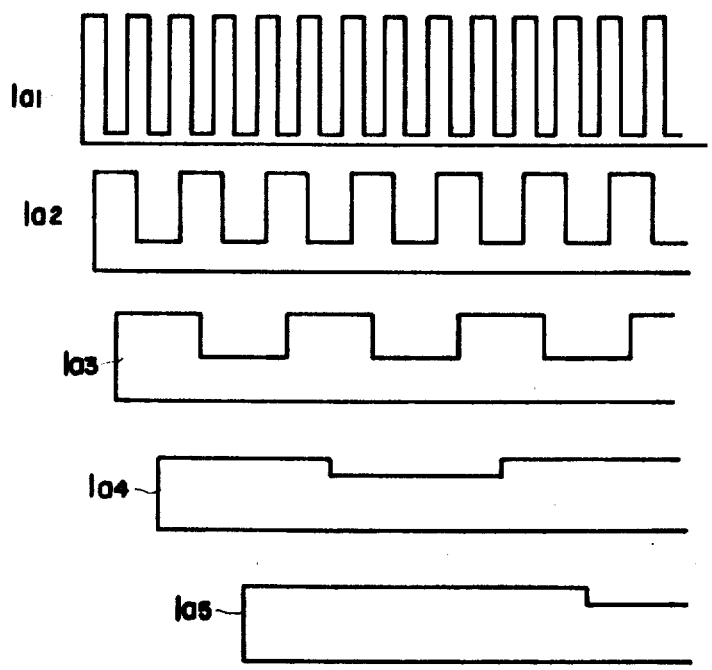

Now, description will be given of the results of experiments given according to the present invention. FIG. 13 shows outputs from respective coils $1a1$, $1a2$, $1a3$, $1a4$, $1a5$, when the magnetic head is moved in a given direction at a given speed, after setting the width of the edge of magnetic head to 0.03 mm, the exciting frequency to 1 MHz, and the ratio, $l_1 / l_2$ to 5. The pitches of coils $1a1$ to $1a5$ are 0.25 mm, 0.5 mm, 1.0 mm, 2.0 mm, 4.0 mm, respectively. As can be seen from this result, the signal ratios $$R_4 = \frac{Sa_4 (l_2)}{Sa_4 (l_1)} \text{ and } R_5 = \frac{Sa_5 (l_2)}{Sa_5 (l_1)}$$

of the concave portion to the convex portion of coils $1a4$ and $1a5$ is substantially 5, approximating $l_1 / l_2$. However, the signal ratios $R_1$ and $R_2$ in the other coils $1a1$, $1a2$, $1a3$ will be smaller than $l_1 / l_2$, and the ratios will be smaller, as the pitch becomes finer. Meanwhile, in case the size of the displacement sensor is small, then the large ratio $l_1 / l_2$ of the coil cannot be taken, so that the ratio $$(R) \left( = \frac{Sa (l_1)}{Sa (l_2)} \right)$$

of the output amplitude of the coil of a finer pitch is close to 1, and thus it becomes difficult to determine whether the rectified output is a 1 or a 2. For avoiding this shortcoming, the ratio $l_1 / l_2$ should be larger as the pitch of the coil becomes finer, as shown in FIG. 14. On the other hand, as shown in FIG. 15, as the pitch of the coil is finer, even if the extent d1 of the convex portion is larger as compared with the extent d2 of the concave portion, then the similar effect will be obtained. In addition, as shown in FIG. 16, $l_1(1a1) > l_1(1a2) > l_1(1a3)$ may be obtained, by varying the ratio of $l_1 / l_2$, as well as by setting $l_1$ to a larger value, as the pitch of the coil becomes finer.

While we have shown and described several embodiments in accordance with the present invention, it is understood that the same is not limited thereto but is susceptible of numerous changes and modifications as are known to those skilled in the art and we, therefore do not wish to be limited to the details shown and described herein but intend to cover all such changes and modifications as are encompassed by the scope of the appended claims.

What is claimed is:

1. A digital displacement sensor comprising:
   a substantially flat plate made of magnetic material;
   a plurality of sensing coils disposed adjacent one another on said plate, each coil having alternate concave and convex portions, the pitches of the alternate concave and convex portions of adjacent sections of each coil differing from those of adjacent coils; and
   a moving element displaceable in a direction parallel to said sensing coils and including a magnetic head, an edge of which is positioned adjacent to but spaced apart from said coils, and a coil wound around said head which is supplied with a high frequency current.

2. A digital displacement sensor according to claim 1, wherein said plate is in the form of a disc, said coils are disposed along concentric circular lines around the center of said disc, and said moving element is supported to be rotatable about an axial line passing through the center of said disc.

3. A digital displacement sensor according to claim 2, wherein the pitches of the concave and convex portions of each coil change along the circular line in the direction of the displacement of the moving element.

4. A digital displacement sensor according to claim 1, further comprising:
   a noise pick-up coil disposed on said plate adjacent one of said sensing coils and encompassing an area of the surface of said plate substantially equal to the area encompassed by one of said sensing coils, and
   circuit means, coupled to said noise pick-up coil and said sensing coils, for subtracting the output signal from said noise pick-up coil from the output signals from the respective sensing coils.

5. A digital displacement sensor according to claim 1, further comprising:
   a temperature compensation coil disposed on said plate adjacent one of said sensing coils and wherein the width of said temperature compensation coil is the same as the width of the concave portion of a sensing coil, and
   circuit means, coupled to said temperature compensation coil and said sensing coils, for subtracting the output signal from said temperature compensation coil from the output signals from the respective sensing coils.

6. A digital displacement sensor according to claim 1, wherein each sensing coil which has a pitch relatively smaller than the pitch of another sensing coil has a larger ratio of the width of the convex portion thereof to the width of the concave portion thereof in a direction transverse to the displacement of the moving element than a ratio of the width of the convex portion of the another sensing coil to the width of the concave portion of the another sensing coil in a direction transverse to the displacement of the moving element.

7. A digital displacement sensor according to claim 1, wherein each sensing coil which has a pitch relatively smaller than the pitch of another sensing coil has a larger ratio of the extent of the convex portion thereof to the extent of the concave portion thereof in a direction of displacement of the moving element than a ratio of the extent of the convex portion of the another sensing coil to the extent of the concave portion of the another sensing coil in a direction of the displacement of the moving element.

8. A digital displacement sensor according to claim 1, wherein the endmost convex portion of each sensing coil is displaced on the surface of said plate by a distance of one quarter of the pitch of the sensing coil adjacent thereto which has a smaller pitch, relative to the endmost convex portion of the smaller pitch adjacent sensing coil.

9. A digital displacement sensor according to claim 1, further comprising:
   a temperature compensation coil disposed on said plate adjacent one of said sensing coils, said temperature compensation coil having a predetermined width, and
   circuit means, coupled to said temperature compensation coil and said sensing coils, for subtracting the output signal from said temperature compensation coil from the output signals from the respective sensing coils.

10. A digital displacement sensor according to claim 1, wherein said plurality of sensing coils are disposed adjacent one another on said plate in a direction transverse to the displacement direction of said moving element.

11. A digital displacement sensor according to claim 1, wherein said magnetic material of said substantially flat plate is a soft magnetic material.

12. A digital displacement sensor according to claim 1, wherein said magnetic material of said substantially flat plate is a high permeability material.

* * * * *